United States Patent
Tsuruta et al.

(10) Patent No.: US 6,785,115 B2
(45) Date of Patent: Aug. 31, 2004

(54) ELECTROSTATIC CHUCK AND SUBSTRATE PROCESSING APPARATUS

(75) Inventors: Hideyoshi Tsuruta, Nagoya (JP); Satoru Yamada, Nagoya (JP); Kiyoshi Nashimoto, Hachiouzi (JP); Naoki Miyazaki, Hino (JP)

(73) Assignees: NGK Insulators, Ltd., Nagoya (JP); Anelva Corporation, Tokyo (JP)

( * ) Notice: Subject to any disclaimer, the term of this patent is extended or adjusted under 35 U.S.C. 154(b) by 77 days.

(21) Appl. No.: 10/057,804

(22) Filed: Jan. 25, 2002

(65) Prior Publication Data

US 2002/0159217 A1 Oct. 31, 2002

(30) Foreign Application Priority Data

Jan. 29, 2001 (JP) ......................................... 2001-019487

(51) Int. Cl.[7] .............................................. H02N 23/00
(52) U.S. Cl. ....................................... 361/234; 361/233
(58) Field of Search .................................. 361/233–234

(56) References Cited

U.S. PATENT DOCUMENTS

| | | | | |
|---|---|---|---|---|
| 5,530,616 A | | 6/1996 | Kitabayashi et al. | |
| 5,583,736 A | * | 12/1996 | Anderson et al. | 361/234 |
| 5,825,607 A | * | 10/1998 | Burkhart | 361/234 |
| 6,556,414 B2 | * | 4/2003 | Kosakai | 361/234 |

* cited by examiner

*Primary Examiner*—Anthony Dinkins
*Assistant Examiner*—Eric Thomas
(74) *Attorney, Agent, or Firm*—Burr & Brown

(57) ABSTRACT

An electrostatic chuck is provided, having an insulation layer including a mount plane on which a wafer is mounted, an inner electrode provided in the insulation layer, and projecting portions protruding from the mount plane which include contact planes that contact the wafer. A backside gas flows into a space defined by the mount plane, the projecting portions, and the wafer under such a condition that the wafer is attracted to the mount plane so as to maintain the temperature uniformity of the wafer. The total areas of the contact planes of the projecting portions is not less than 5% and not more than 10% with respect to the area of the inner electrode, and the heights of the projecting portions are not less than 5 $\mu$m and not more than 10 $\mu$m.

4 Claims, 3 Drawing Sheets

US 6,785,115 B2

ELECTROSTATIC CHUCK AND SUBSTRATE PROCESSING APPARATUS

This application claims the benefit of Japanese Application 2001-019,487, filed Jan. 29, 2001, the entirety of which is incorporated herein by reference.

BACKGROUND OF THE INVENTION (1) Field of the Invention

The present invention relates to an electrostatic chuck which can achieve a uniform temperature distribution of a wafer and suppress a particle generation.

(2) Related Art Statement

At present, electrostatic chucks are used for attracting and holding semiconductor wafers in finely working e.g., transferring, exposing, film-forming by CVD, washing, etching, and dicing the semiconductor wafers. Normally, a plurality of projecting portions or embossed portions protruded from a mount plane of an insulation layer, and crown planes (contact planes) of the projecting portions are contacted to the semiconductor wafer. Moreover, DC voltage is applied to an inner electrode in the insulation layer, and Johnson-Rahbeck force is generated at a contact boundary between the semiconductor wafer and the projecting portions, so that the semiconductor wafer is attracted on the contact planes. Therefore, if an area of contact planes (crown planes) is increased, it is possible to improve an attraction of the semiconductor wafer.

Further, in order to perform predetermined processes such as film-forming and so on with respect to the semiconductor wafer, it is necessary to maintain a temperature of the semiconductor wafer at a constant temperature and to make a temperature at respective portions of the semiconductor wafer uniform. In this case, if a temperature of the insulation layer of the electrostatic chuck is increased by a built-in heater and so on, a heat is conducted from the insulation layer to the semiconductor wafer at a contact region between the contact planes of the projecting portions and a rear plane of the semiconductor wafer. However, in the method mentioned above, since a contacting state between the projecting portions and the semiconductor wafer is varied in accordance with a slight hardness variation of the contact planes of the projecting portions or a concavo-convex variation of a plane surface, a heat contacting resistance is varied at respective contact planes of respective projecting portions. Therefore, a heat from the insulation layer cannot be conducted stably to the overall semiconductor wafer, and thus a temperature uniformity of the semiconductor wafer is liable to be decreased. In order to eliminate such a drawback, there is proposed a method wherein a backside gas with a constant pressure is flowed through a space between the rear plane of the semiconductor wafer and the insulation layer, and a heat from the insulation layer is conducted to the semiconductor wafer by utilizing a heat radiation and a heat convection from the backside gas. In this case, if a pressure of the backside gas becomes larger, such tendencies are detected that, a heat conduction from the insulation layer to the semiconductor wafer becomes larger, and a temperature uniformity of the semiconductor wafer can be improved.

However, if the area of the contact planes of the projecting portions is made larger so as to improve an attraction of the semiconductor wafer, the rear plane of the semiconductor wafer and the contact planes of the projecting portions are rubbed, so that particles are generated and deposited on the contact planes of the projecting portions, and further, there is a possibility such that they are adhered to the semiconductor wafer.

On the other hand, if an area of the contact planes of the projecting portions is made smaller, a particle generation is decreased and thus an adhesion of particles to the projecting portions is decreased. However, in this case, since Johnson-Rahbeck force acting between the contact planes and the semiconductor wafer is decreased, an attraction force of the semiconductor wafer is also decreased.

Further, when the backside gas with a predetermined pressure flows between the rear plane of the semiconductor wafer and the insulation layer, an ascending force due to the backside gas is applied to the semiconductor wafer. Therefore, an attraction force actually acting on the semiconductor wafer becomes such a value that the ascending force acting from the backside gas to the semiconductor wafer is taken from an attraction force due to electrostatic effects acting from the electrostatic chuck to the semiconductor wafer. In this case, if an area of the contact planes of the projecting portions is decreased as mentioned above the ascending force acting to the semiconductor wafer becomes relatively larger, and thus the attraction force of the semiconductor wafer is not sufficient. In order to eliminate such a drawback, if the pressure of the backside gas is made smaller, heat conduction due to the backside gas becomes insufficient, and thus a temperature uniformity of the semiconductor wafer is deteriorated.

SUMMARY OF THE INVENTION

An object of the present invention is to provide an electrostatic chuck having projecting portions protruded from a wafer mount plane, wherein a backside gas is flowed in a space defined by the wafer mount plane, the projecting portions and the wafer under such a condition that the wafer is attracted to the wafer mount plane so as to maintain the temperature uniformity of the wafer, which can reduce particles generated by rubbing between the projection portions and the wafer and improve the temperature uniformity of the wafer.

According to the invention, an electrostatic chuck having an insulation layer including a mount plane on which a wafer is mounted, an inner electrode provide in the insulation layer, and projecting portions protruded from the mount plane which include contact planes to be contacted to the wafer, wherein a backside gas is flowed in a space defined by the mount plane, the projecting portions, and the wafer under such a condition that the wafer is attracted to the mount plane so as to maintain a temperature uniformity of the wafer, comprises a construction such that a total amount of areas of the contact planes of the projecting portions is not less than 5% and not more than 10% with respect to an area of the inner electrode, and heights of the projecting portions are not less than 5 $\mu$m and not more than 10 $\mu$m.

Moreover, according to the invention, a substrate processing apparatus wherein a predetermined process is applied to a plane of a substrate, comprises: a process chamber in which the predetermined process is performed; the electrostatic chuck used for electrostatically attracting and holding the substrate at a predetermined position in the process chamber; and a power source for attracting.

The present inventors found the following and achieved the present invention. That is, even in the case such that a total amount of areas of the contact planes of the projecting portions to be contacted to the wafer is made smaller to a level of not more than 10% with respect to an area of the inner electrode so as to reduce particle generations, if heights of the projecting portions are controlled to not less than 5 $\mu$m and not more than 10 $\mu$m, it is possible to effectively perform heat conduction through the backside gas from the electrostatic chuck to the semiconductor wafer, and thus, it is possible to maintain high temperature uniformity for the semiconductor wafer.

This is further explained. Generally, a height of the projecting portion of the electrostatic chuck was about 20 $\mu$m, and heat was conducted by heat convection between the insulation layer and the semiconductor wafer. Therefore, it was thought that a low height of the projecting portion is not effective upon a heat conduction.

However, it was understood that, if a height of the projecting portion is controlled actually to 5–10 $\mu$m, it is effective upon a heat conduction from another point of view. That is, it was assumed that coulomb force is acted between electric charges suspended near a plane of the insulation layer and electrostatic charges of the semiconductor wafer, other than an attraction force due to Johnson-Rahbeck force at a contact region between the projecting portions and the semiconductor wafer. Therefore, it was understood that an electrostatic attraction force of the semiconductor wafer is not decreased as expected. As a result, a pressure of the backside gas between the rear plane of the semiconductor wafer and the mount plane is made larger, and a heat conduction through the backside gas is effectively performed, so that it is possible to achieve a uniform temperature distribution of the semiconductor wafer. In order to obtain such advantages, it is necessary to set a height of the projecting portion to not more than 10 $\mu$m. From this point of view, it is more preferred to set a height of projecting portion to not more than 8 $\mu$m.

Moreover, it was understood that, if a height of the projecting portion is made smaller, a contribution of coulomb force mentioned above becomes larger, and an electrostatic attraction force is further improved. However, in the case such that a height of the projecting portion becomes less than 5 $\mu$m, a heat conduction efficiency was decreased even if a pressure of the backside gas was made larger, and thus a temperature uniformity of the semiconductor wafer was decreased. Assumably, it was understood that, if a height of the projecting portion becomes less than 5 $\mu$m, a heat convection is not contributed and thus a heat conduction is mainly performed by a heat radiation. Moreover, it is understood that, since the particles on the mount plane are not directly contacted to the semiconductor wafer but are attracted electrostatically to the semiconductor wafer, it is difficult to reduce the particles from the semiconductor wafer. From this point of view, it is further preferred to set a height of the projecting portion to not less than 6 $\mu$m.

Further, if a total amount of areas of the contact planes of the projecting portions to be contacted to the wafer is less than 5% with respect to an area of the inner electrode, an attraction force is lowered excessively even with taking into consideration of a contribution of coulomb force mentioned above, and thus it is not possible to flow the backside gas with a sufficiently high pressure, so that a temperature uniformity of the semiconductor wafer is decreased.

From the above point of view, it is further preferred to set a total amount of areas of the contact planes of the projecting portions to be contacted to the wafer to not more than 8% and not less than 6% with respect to an area of the inner electrode.

An area of the contact plane of the projecting portion to be contacted to the wafer means an area contacting to the rear plane of the wafer during a normal wafer attracting state. This is normally equal to an area of a top plane of the projecting portion. In this case, if some projecting portions have a low height and they are not contacted to the rear plane of the wafer during a normal wafer mounting state, top planes of those projecting portions are not included in this area.

Moreover, both of an area of the inner electrode and an area of the contact plane of the projecting portion means the area measured from a vertical direction with respect to the mount plane.

A height of the projecting portion is measured by a dial-gauge or a three-dimensional shape measuring apparatus.

The kinds of processes with respect to the substrate are not limited, but mention may be made of finely working e.g., transferring, exposing, film-forming by CVD, washing, etching, and dicing the semiconductor wafers.

The kind of substrate is not limited, but it is preferred to use a semiconductor wafer.

As the chamber and the power source for electrostatically attracting, use may be made of the known members in their technical fields.

BRIEF DESCRIPTION OF THE DRAWINGS

For a better understanding of the invention, reference is made to the attached drawings, wherein.

DETAILED DESCRIPTION OF THE INVENTION

Figure 1:
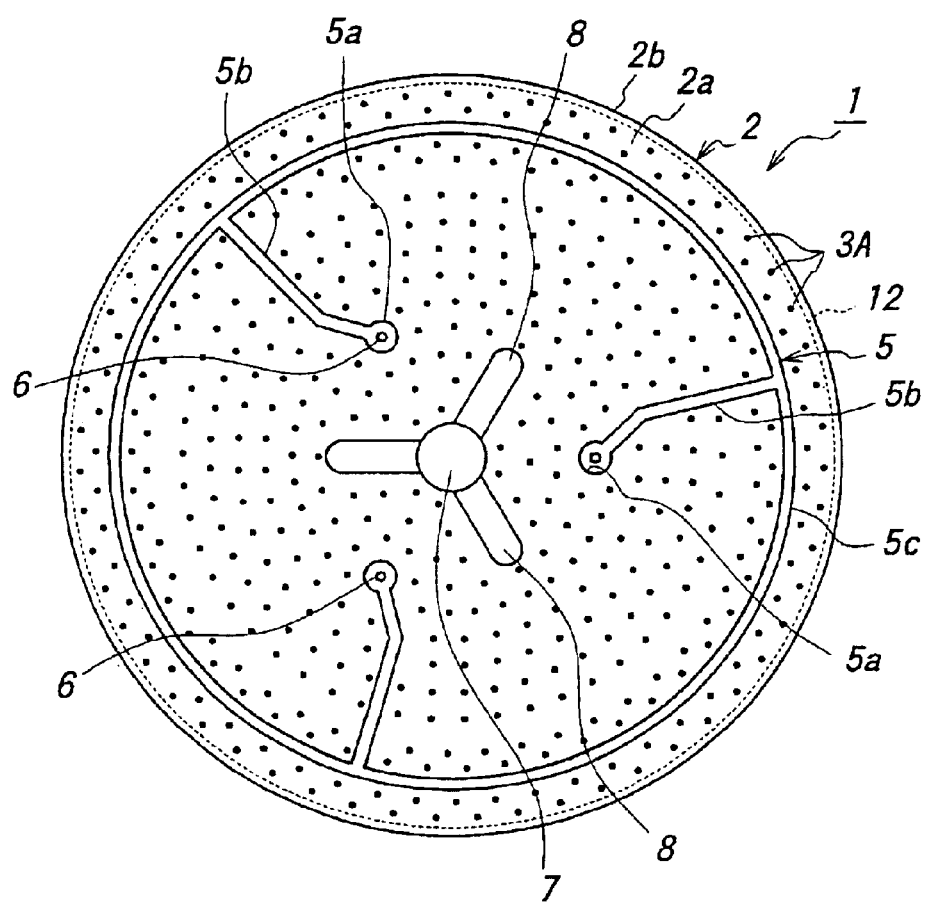
FIG. 1 is a plan view showing one embodiment of an electrostatic chuck according to the invention.
Figure 2:
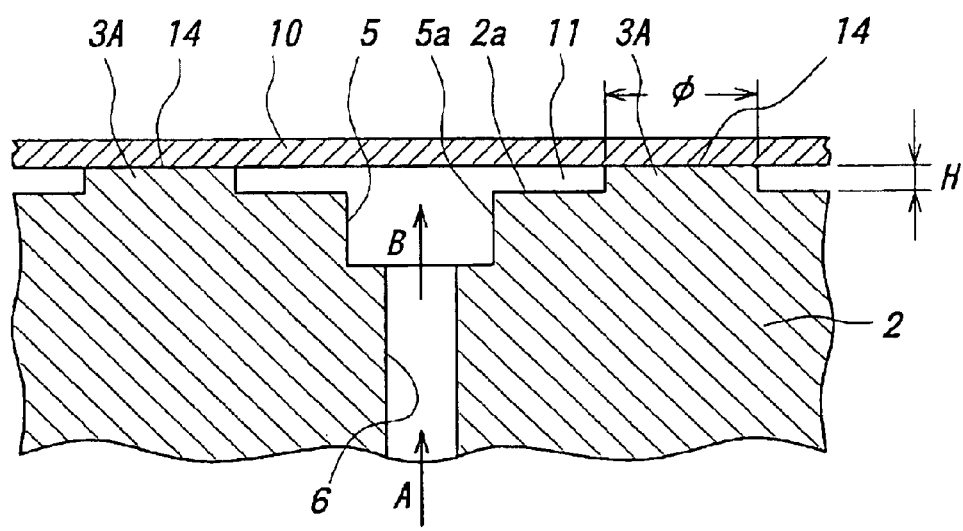
FIG. 2 is a partially enlarged cross sectional view illustrating the electrostatic chuck shown in FIG. 1.

FIG. 1 is a plan view showing one embodiment of an electrostatic chuck 1 according to the invention. FIG. 2 is a partially enlarged cross sectional view illustrating the electrostatic chuck shown in FIG. 1.

In the embodiment shown in FIG. 1, the electrostatic chuck 1 comprises an insulation layer 2 having a disc shape and an inner electrode 12 embedded in the insulation layer 2. A numeral 2b is a side plane (outer surface) of the insulation layer 2, and a numeral 2a is a planar mount plane of the insulation layer 2. Plural projecting portions 3A are protruded from the mount plane 2a. Respective projecting portions 3A has a plate shape more preferably a disc shape. The projecting portions 3A are separated with each other, and they are scattered on the mount plane 2a.

Moreover, gas supply holes 6 are formed in the insulation layer 2 at for example three positions in this embodiment, and a gas distribution recess 5 is communicated with upper end portions of the gas supply holes 6. The gas distribution recess 5 comprises depression portions 5a continuing from the gas supply holes 6, long recesses 5b extending toward the side plane 2b from the depression portion 5a, and a circular recess 5c continuing from a tip portion of respective recesses 5b. The gas distribution recess 5 is formed at a lower position with respect to the mount plane 2a. Therefore, as shown in FIG. 2, when a backside gas is supplied to the gas supply hole 6 as shown by an arrow A, the backside gas is introduced into the depression portion 5a as shown by an arrow B, which is flowed through the recesses 5b and 5c. In this case, the backside gas is flowed into a space 11 defined by the mount plane 2a, the projecting portions 3A and a semiconductor wafer 10 from all of the recesses 5a and 5c.

At a center portion of the insulation layer 2, a circular through hole 7 and recesses 8 extending radial toward peripheral three directions are formed. The projecting portions 3A are not formed near the through hole 7 and the recess 8.

According to the invention, the total amount of the areas of the top planes 14 of the projection portions 3A that are contact planes with respect to the semiconductor wafer is not less than 5% and not more than 10% of this area of the inner electrode 12. Moreover, a height H of the projecting portion 3A is set to not less than 5 μm and not more than 10 μm.

In the present invention, the diameter of respective projecting portions can be varied in various ways, but it is preferred to set such a diameter to 1.0–2.0 mm from a point of view of achieving temperature uniformity for the wafer.

Moreover, a two-dimensional shape and a two-dimensional size are varied in various ways. For example, the shape of the contact plane of the projecting portion may be polygonal shape such as triangular shape, quadrangle shape, hexagonal shape, octagonal shape and so on other than circular shape. Moreover, the number of the projecting portions is not particularly limited. However, in order to make the attractive force with respect to the semiconductor wafer uniform on all the planes of the semiconductor wafer, it is particularly preferred to set the number of the projecting portions per a unit area to 0.010–0.140 pieces/mm².

Figure 3:
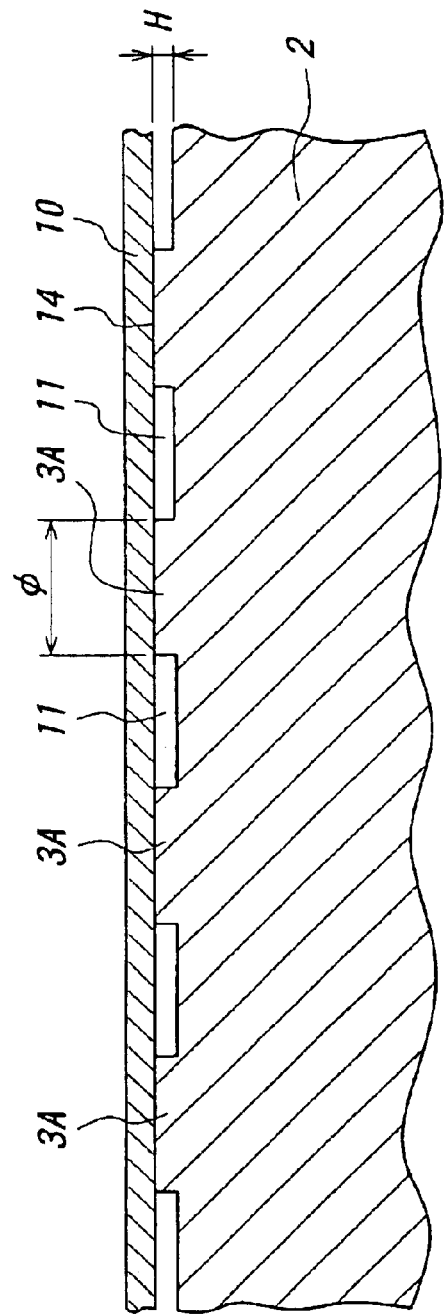
FIG. 3 is a schematic view depicting a state such that projecting portions are aligned side-by-side on a plane of the electrostatic chuck.

It is preferred to align the projecting portions side-by-side continuously. In this case, it is possible to reduce a lack in uniformity of the attraction force of the wafer and to further improve a temperature uniformity of the wafer. Here, a term "align the projecting portions side-by-side continuously" means that, when viewed from a direction parallel to the attraction plane as shown in FIG. 3 for example, the projecting portions 3A and the recesses (spaces 11) between the projecting portions 3A are arranged alternately. Preferably, the projecting portions 3A are arranged regularly with a predetermined constant interval.

Materials of the insulation layer 2 are not limited, but it is preferred from a point of view of further reducing a particle generation to use ceramics of aluminum nitride series, composite materials including aluminum nitride, ceramics of alumina series, composite materials including alumina, and composite ceramics of alumina and aluminum nitride.

Materials of the inner electrode are not also limited, and use may be made of conductive ceramics and metals. However, it is preferred to use a metal having a high melting point such as molybdenum, tungsten, and alloy of molybdenum and tungsten.

Materials of the projecting portions are not particularly limited, but it is preferred from a point of view of further reducing the particle generation to use ceramics of aluminum nitride series, composite materials including aluminum nitride, ceramics of alumina series, composite materials including alumina, and composite ceramics of alumina and aluminum nitride. The projecting portions are formed by blast working, chemical vapor epitaxy method and so on.

As the backside gas, use may be made of known gasses such as helium gas, argon gas, and a mixture gas of helium gas and argon gas.

In order to improve a heat conductivity to the semiconductor wafer, it is preferred to set a pressure for supplying the backside gas to thee gas supply hole to not less than 5 Torr more preferably not less than 15 Torr. In this case, if this pressure is increased excessively, an attraction force to the wafer is decreased and the wafer is liable to deviate. Therefore, it is preferred to set this pressure to not more than 30 Torr.

The electrostatic chuck having the shape shown in FIGS. 1 and 2 was produced. Specifically, aluminum nitride powders were formed into a specific shape to obtain a formed body. Then, the inner electrode made of molybdenum was arranged on the thus obtained formed body, and aluminum nitride powders are filled thereon. After that, the forming process was performed again to obtain the disc-shaped formed body in which the inner electrode was embedded. Then, the thus obtained formed body was sintered in nitrogen atmosphere to produce the insulation layer 2 having a diameter of 200 mm in which the inner electrode was embedded.

Then, plural projection portions 3A each having a two-dimensionally circular shape as shown in FIG. 1 were formed on a front plane of the insulation layer 2 by a blast working. Moreover, the through hole 7 and the gas distribution recess 5 were formed in the insulation layer.

An area of the inner electrode 12 was 31000 mm². By varying the area of the contact plane 14 of the projecting portion 3A and the number of the projecting portions 3A in various ways, the percentages of the total amounts of the areas of the contact planes 14 with respect to an area of the inner electrode 12 were varied as shown in the following Table 1 and Table 2. Moreover, the heights H of the projecting portions 3A were also varied as shown in the following Table 1 and Table 2.

The silicon wafer 10 having a diameter of 200 mm was mounted on the mount plane 2a of the electrostatic chuck 1. The rear plane of the silicon wafer 10 was contacted to the contact planes 14 of the projecting portions 3A. DC voltages of ±500 V were applied to the inner electrode 12 so as to attract the silicon wafer 10 to the electrostatic chuck 1. Then, an electrostatic attraction force of the silicon wafer was measured at a pressure (Torr) unit under such a condition that the backside gas was not flowed.

Then, argon gas was supplied into the space 11 defined by the silicon wafer 10, the insulation layer 2 and the projecting portions 3A as mentioned above. By heating the insulation layer 2, an average temperature of the silicon wafer was increased to 350° C. The pressure for supplying the backside gas was controlled in such a manner that an attraction force of the silicon wafer after supplying the backside gas was maintained at about 30 Torr. Under such a condition, temperatures of the silicon wafer were measured at five points by using the wafer with thermocouple, and a temperature difference between the maximum and the minimum was obtained.

Moreover, after the silicon wafer was attracted for one minute at 350° C. as mentioned above, the attraction of the silicon wafer was ceased. Then, the number of the particles adhered to the rear plane of the silicon wafer was counted by using the particle counter utilized normally in the semiconductor manufacturing factory. These results were also shown in the following Table 1 and Table 2.

TABLE 1

| | | | | | |
|---|---|---|---|---|---|
| Percentage of areas of contact planes of projection portions with respect to area of inner electrode (%) | 3 | 5 | 7 | 10 | 15 |
| Height of projecting portion H (mm) | 7 | 7 | 7 | 7 | 7 |
| Electrostatic attraction (g/mm$^2$) (no backside gas) | 40 | more than 50 | more than 50 | more than 50 | more than 50 |
| Temperature difference of silicon wafer between maximum and minimum (° C.) | ±5 | ±3 | ±2 | ±3 | ±3 |
| The number of particles (piece/mm$^2$) | 2 | 2 | 3 | 5 | 20 |

TABLE 2

| | | | | | |
|---|---|---|---|---|---|
| Percentage of areas of contact planes of projection portions with respect to area of inner electrode (%) | 7 | 7 | 7 | 7 | 7 |
| Height of projecting portion H (mm) | 3 | 5 | 7 | 10 | 15 |
| Electrostatic attraction (g/mm$^2$) (no backside gas) | more than 50 | more than 50 | more than 50 | more than 50 | 25 |
| Temperature difference of silicon wafer between maximum and minimum (° C.) | ±10 | ±3 | ±2 | ±3 | wafer peeling due to gas pressure |
| The number of particles (piece/mm$^2$) | 20 | 5 | 3 | 5 | — |

According to the electrostatic chuck of the present invention, it is possible to reduce the particles generated due to the rubbing between the projection portions and the semiconductor wafer, and also it is possible to improve of the temperature uniformity of the semiconductor wafer.

What is claimed is:

1. An electrostatic chuck having an insulation layer including a mount plane on which a wafer is mounted, an inner electrode provided in the insulation layer, and projecting portions protruding from the mount plane which include contact planes that contact said wafer;

wherein a backside gas flows in a space defined by said mount plane, said projecting portions, and the wafer such that the wafer is attracted to said mount plane so as to maintain temperature uniformity of the wafer; and wherein a total area of said contact planes of said projecting portions is in a range of 5% to 10% of an area of said inner electrode, and a height of each said projecting portion is in a range of 5 µm to 10 µm.

2. The electrostatic chuck according to claim 1, wherein a diameter of each said projecting portion is in a range of 1.0 mm to 2.0 mm.

3. The electrostatic chuck according to claim 1, wherein said projecting portions are aligned side-by-side continuously.

4. A substrate processing apparatus wherein a predetermined process is applied to a plane of a substrate, said apparatus comprising:

a process chamber in which the predetermined process is performed;

said electrostatic chuck set forth in claim 1 that electrostatically attracts and holds the substrate at a predetermined position in said process chamber; and a power source that electrostatically attracts the substrate to said electrostatic chuck.

* * * * *